United States Patent
Tu et al.

(10) Patent No.: US 10,007,176 B2
(45) Date of Patent: Jun. 26, 2018

(54) GRAPHENE PELLICLE FOR EXTREME ULTRAVIOLET LITHOGRAPHY

(71) Applicant: Taiwan Semiconductor Manufacturing Co., Ltd., Hsin-Chu (TW)

(72) Inventors: Chih-Chiang Tu, Tauyen (TW); Chun-Lang Chen, Tainan County (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 41 days.

(21) Appl. No.: 15/356,386

(22) Filed: Nov. 18, 2016

(65) Prior Publication Data

US 2018/0059535 A1    Mar. 1, 2018

Related U.S. Application Data

(60) Provisional application No. 62/382,542, filed on Sep. 1, 2016, provisional application No. 62/382,579, filed on Sep. 1, 2016.

(51) Int. Cl.
| | |
|---|---|
| *G03F 1/62* | (2012.01) |
| *G03F 1/64* | (2012.01) |
| *H01L 21/033* | (2006.01) |
| *C23C 14/18* | (2006.01) |
| *C23C 16/26* | (2006.01) |
| *C23C 28/00* | (2006.01) |
| *C23C 14/16* | (2006.01) |

(52) U.S. Cl.
CPC .............. *G03F 1/64* (2013.01); *G03F 1/62* (2013.01); *H01L 21/0332* (2013.01); *H01L 21/0335* (2013.01); *H01L 21/0337* (2013.01); *C23C 14/16* (2013.01); *C23C 14/18* (2013.01); *C23C 16/26* (2013.01); *C23C 28/32* (2013.01)

(58) Field of Classification Search
CPC ......... G03F 1/62; G03F 1/64; H01L 21/0332; H01L 21/0335; H01L 21/0337; C23C 14/16; C23C 14/18; C23C 16/26; C23C 28/32
USPC ........................................................... 430/5
See application file for complete search history.

(56) References Cited

U.S. PATENT DOCUMENTS 9,415,847 B2    8/2016   Shen et al.

OTHER PUBLICATIONS

L. Baraton et al. "On the mechanisms of precipitation of graphene on nickel thin films" EPL, European Physical Society/EDP Science/Societe Italians di Fisica/IOP Publishing, 2011, 96, pp. 46003 (7 Pages).
U.S. Appl. No. 14/754,902, filed Jun. 30, 2015 by inventors Kuan-Wen Lin, Sheng-Chi Chin, Ting-Hao Hsu, Tzu-Ting Chou, Shu-Hsien Wu, for "Mask Pellicle Indicator, for Haze Prevention" 13pages of text, 4 pages of drawings.

*Primary Examiner* — Christopher G Young

(74) *Attorney, Agent, or Firm* — Haynes and Boone, LLP

(57) ABSTRACT

A method includes depositing a first material layer over a substrate; and depositing a graphene layer over the first material layer, thereby forming a first assembly. The method further includes attaching a carrier to the graphene layer; removing the substrate from the first assembly; and removing the first material layer from the first assembly.

20 Claims, 5 Drawing Sheets

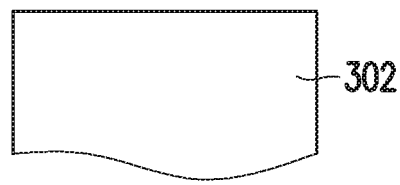
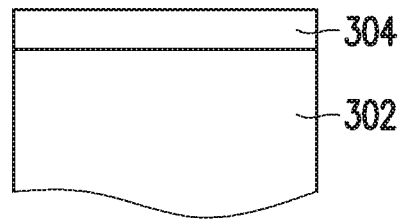
FIG. 3A	FIG. 3B
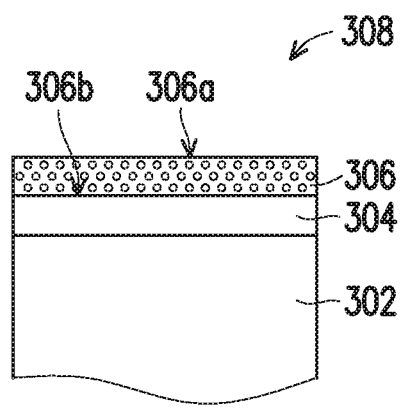
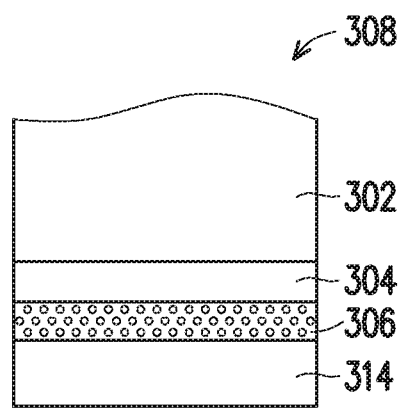
FIG. 3C	FIG. 3D

GRAPHENE PELLICLE FOR EXTREME ULTRAVIOLET LITHOGRAPHY

PRIORITY

This claims the benefits of U.S. Prov. App. Ser. No. 62/382,542, entitled "Graphene Pellicle for Extreme Ultraviolet Lithography," filed Sep. 1, 2016, the entire disclosure of which is incorporated herein by reference. This also claims the benefits of U.S. Prov. App. Ser. No. 62/382,579, entitled "Graphene Pellicle for Extreme Ultraviolet Lithography," filed Sep. 1, 2016, the entire disclosure of which is incorporated herein by reference. This also relates to U.S. patent application Ser. No. 15/356,204, entitled "Graphene Pellicle for Extreme Ultraviolet Lithography," filed Nov. 18, 2016, the entire disclosure of which is incorporated herein by reference.

BACKGROUND

As the semiconductor industry progresses into nanometer technology in pursuit of higher device density, higher performance, and lower costs, stricter demands have been placed on the lithography tools used in semiconductor manufacturing. Techniques such as extreme ultraviolet (EUV) lithography have been utilized to support critical dimension (CD) requirements of smaller IC devices. EUV lithography uses radiation in the EUV region, having a wavelength of about 1-100 nm, such as 13.5 nm, which is much shorter than the wavelengths in the deep ultraviolet (DUV) lithography (e.g., 193 nm lithography). EUV lithography uses masks (or reticles) that reflect EUV radiation from a radiation source towards a target (such as a silicon wafer), thereby transferring patterns from the masks to the target. Any defect on the surface of a EUV mask (as well as defects embedded in the EUV mask) may cause imaging defects on the target. Therefore, it is important to protect the EUV mask surface during lithography processes.

Unlike the masks used in DUV lithography, which traditionally employ a pellicle to protect the mask surface, it is currently difficult to manufacture an effective pellicle for EUV masks on a large scale. One reason is that the wavelength of the EUV radiation is very short and membranes of traditional pellicles would absorb the EUV radiation so much that they would deform due to excessive heat after few uses and also would substantially reduce the EUV energy reaching the target. Improvements in these areas are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A, 3B, 3C, 3D, 3E, 3F, 3G, 3I, and 3J are cross-sectional views of an apparatus during various fabrication stages, according to some embodiments of the present disclosure.

DETAILED DESCRIPTION

Figure 1:
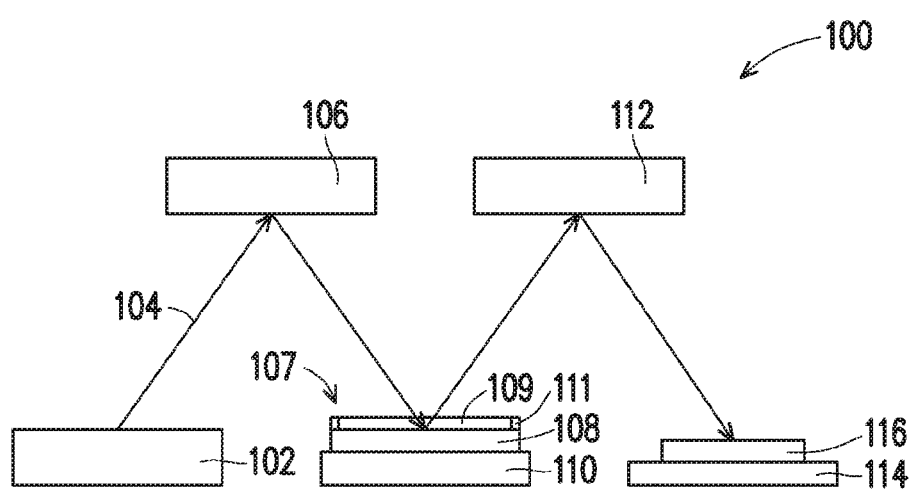
FIG. 1 is a simplified schematic diagram of a lithography system that may benefit from various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to apparatuses for semiconductor fabrication. More particularly, the present disclosure is related to a pellicle membrane/frame assembly for use in EUV lithography and methods of making the pellicle membrane/frame assembly. According to the present disclosure, a new pellicle membrane comprises a graphene layer, which may be a single layer graphene or a multilayer graphene (including bilayer and more than two layers). Graphene is fundamentally one single layer of graphite, a layer of $sp^2$-bonded carbon atoms arranged in a honeycomb (hexagonal) lattice. Graphene possesses extraordinary properties that are suitable for EUV lithograph. For example, a graphene layer can be made very thin, such as few nanometers (nm) to few tens of nanometers. In addition, graphene is the strongest material ever recorded, more than forty times stronger than diamond. Further, graphene conducts heat and electricity efficiently and is nearly transparent. Though with these extraordinary properties, graphene has not been mass-produced as EUV pellicle membranes. One challenge is that it has been difficult to extract a single or few layer graphene on a large scale without causing damages (e.g., wrinkles and/or breakages) to the graphene. To be used as a EUV pellicle membrane, a graphene layer should be smooth, with as few wrinkles as possible. Otherwise, the wrinkles not only affect lithography imaging but also become a source of deformation for the pellicle membrane. The present disclosure provides a novel process of making a smooth graphene layer on a large scale.

For the convenience of discussion, the present disclosure uses the term "a material layer" to refer to a layer comprising the material. As such, the material layer may comprise other element(s) or ingredient(s) besides the particular material. For example, "a nickel layer" refers to a layer comprising nickel even though the layer may comprise other element(s) in addition to nickel. In addition, "a silicon substrate" refers to a substrate comprising silicon even though the substrate may comprise other element(s) in addition to silicon.

FIG. 1 shows an exemplary EUV lithography system 100 that can benefit from one or more embodiments of the present disclosure. The system 100 includes a radiation source 102 that produces a radiation beam 104, condenser optics 106, a mask 108 on a mask stage 110, a pellicle assembly 107 disposed on the mask 108 and having a pellicle membrane 109 mounted on a pellicle frame 111, projection optics 112, and a target 116 on a target stage 114. Other configurations and inclusion or omission of items may be possible. In the present disclosure, the system 100 may be a stepper or a scanner.

In the present embodiment, the radiation source 102 provides the radiation beam 104 having a wavelength in the EUV range, such as about 1-100 nm. In an embodiment, the radiation beam 104 has a wavelength of about 13.5 nm. The condenser optics 106 includes a multilayer coated collector and a plurality of grazing mirrors. The condenser optics 106 is configured to collect and shape the radiation beam 104 and to provide a slit of the EUV beam 104 to the mask 108.

The mask 108, also referred to as a photomask or a reticle, includes patterns of one or more target IC devices. The mask 108 provides a patterned aerial image to the radiation beam 104. The mask 108 is a reflective mask in the present embodiment, and may incorporate resolution enhancement techniques such as phase-shifting mask (PSM) and/or optical proximity correction (OPC). The pellicle frame 111 is a rigid frame. In an embodiment, the pellicle frame 111 comprises anodized aluminum alloy. The pellicle membrane 109 comprises a graphene layer in the present embodiment. The pellicle membrane 109 protects the surface of the mask 108 from outside contaminants. Due to different depth of focus (DOF), impurities on the surface of the pellicle membrane 109 do not affect the patterned aerial image generated by the mask 108. The mask stage 110 secures the mask 108 thereon, such as by vacuum, and provides accurate position and movement of the mask 108 during alignment, focus, leveling and exposure operation in the EUV lithography system 100.

The projection optics 112 includes one or more lens and a plurality of mirrors. The lens may have a magnification of less than one thereby reducing the patterned aerial image of the mask 108 to the target 116. In an embodiment, the target 116 includes a semiconductor wafer with a photoresist (or resist) layer coated thereon, which is sensitive to the radiation beam 104. The target 116 is secured by the substrate stage 114 which provides accurate position and movement of the target 116 during alignment, focus, leveling and exposing operation in the EUV lithography system 100 such that the patterned aerial image of the mask 108 is exposed onto the target 116 in a repetitive fashion (though other lithography methods are possible). After the target 116 is exposed to the radiation beam 104, it is moved to other tools for further processing. For example, the target 116 may undergo resist developing and various etching processes in order to form the target IC devices.

The pellicle membrane 109 plays an important role in the EUV lithography system 100, as it reduces imaging defects and prolongs the usable life of the mask 108. Traditional pellicle membranes (e.g., those used in DUV lithography) are typically made of nitrocellulose, fluororesin, plastic resin, synthetic quartz glass, or the like; and are typically few microns thick. Those pellicle membranes cannot be practically used in EUV lithography due to their excessive absorption of EUV radiation. In the present embodiment, the pellicle membrane 109 comprises a graphene layer (or a graphene film), which is thinner and stronger than the traditional DUV pellicle membranes. However, it has been difficult to extract a graphene layer for the purposes of EUV pellicle membrane without causing damages to the graphene layer. A common damage to a graphene layer is breaking and/or wrinkling the graphene layer during the extraction process. Due to its large surface energy and out of plane ductility, flat graphene films without structural support are unstable with respect to scrolling, i.e. bending into a cylindrical shape. The present disclosure provides a new and improved process for making a graphene layer which is substantially flat and wrinkle-free. The new and improved process can be used for manufacturing graphene layers for the purposes of EUV pellicle in a large volume. Of course, the use of these graphene layers is not limited to pellicle membranes, EUV or otherwise.

Figure 2:
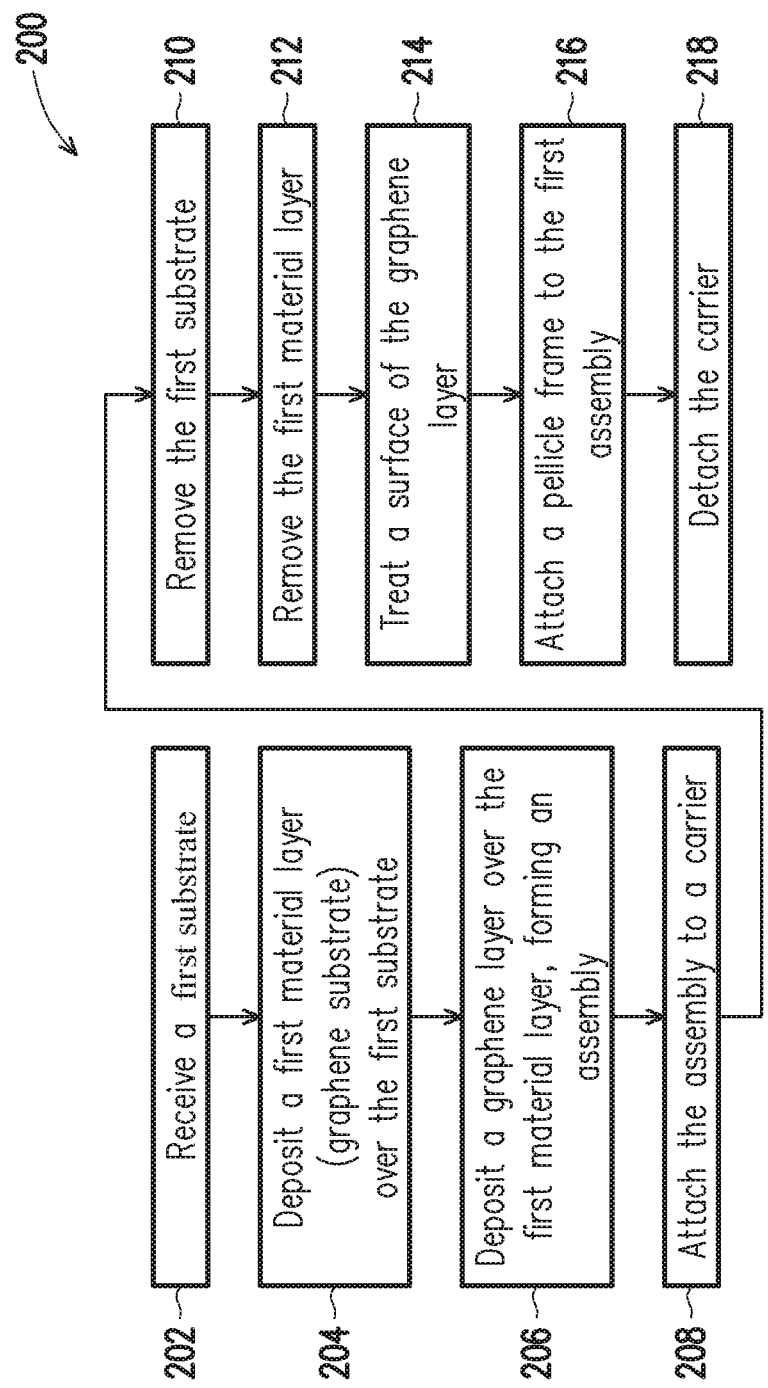
FIG. 2 is a flowchart illustrating a method of making a pellicle for use in a EUV lithography system, according to various aspects of the present disclosure.

FIG. 2 is a flow chart of a method 200 of making a pellicle having a graphene layer according to various aspects of the present disclosure. Additional operations can be provided before, during, and after the method 200, and some operations described can be replaced, eliminated, or moved around for additional embodiments of the method. The method 200 is an example, and is not intended to limit the present disclosure beyond what is explicitly recited in the claims.

At operation 202, the method 200 (FIG. 2) receives a substrate 302 (FIG. 3A). In the present embodiment, the substrate 302 is a silicon substrate. In other words, it is a substrate comprising silicon. The substrate 302 may comprise other element(s) in addition to silicon. The silicon may be single crystalline silicon or polycrystalline silicon. In an embodiment, the substrate 302 is a silicon wafer, such as an eight inch silicon wafer or a twelve inch silicon wafer. In another embodiment, the substrate 302 is a portion of a silicon wafer. In alterative embodiments, the substrate 302 may comprise silicon nitride, or one or more III-V semiconductors such as gallium arsenide. In an embodiment, the substrate 302 may be round or rectangular depending on a dimension of a target pellicle. In various embodiments, the substrate 302 may be of few microns to few hundreds of microns thick.

At operation 204, the method 200 (FIG. 2) deposits a first material layer 304 over the substrate 302, as illustrated in FIG. 3B. The first material layer 304 is also referred to as a "graphene substrate" as it is used for depositing a graphene layer thereon. In the present embodiment, the first material layer 304 comprises nickel (Ni). Therefore, it is also referred to as a nickel layer 304. In the present embodiment, the nickel layer 304 is deposited by sputtering and has a thickness in a range from 50 to 500 nanometers (nm), such as from 50 to 100 nm. In another embodiment, the nickel layer 304 has a thickness of about 100 nm. In alternative embodiments, the first material layer 304 may comprise silicon, copper, glass, aluminum, cobalt, iron, steel, gold, platinum, titanium, molybdenum, gallium, ruthenium, silver, tungsten, iridium, or ceramics. In various embodiments, the first material layer 304 may be deposited by any suitable methods such as chemical vapor deposition (CVD), physical vapor deposition (PVD), and plating. Further, the first material layer 304 comprises a different material or a different composition than the substrate 302. In some embodiments, an additional layer may be formed between the substrate 302 and the first material layer 304. For example, a silicon oxide layer may be formed between the silicon substrate 302 and the nickel layer 304.

At operation 206, the method 200 (FIG. 2) deposits a graphene layer 306 over the first material layer 304 (FIG. 3C). In the present embodiment, the graphene layer 306 comprises a single layer graphene or a multilayer graphene (including bilayer or more than two layers). The graphene layer 306 is deposited using chemical vapor deposition (CVD) in the present embodiment. For example, the CVD process may involve four stages. In the first stage, a reduction gas such as $H_2$ is introduced into a reaction chamber with a suitable flow rate such as from 10 sccm (standard cubic centimeter per minute) to 1,000 sccm. The reaction chamber may be set to a suitable temperature such as from 600 to 1,000 degrees Celsius. In the second stage, carbon segregation occurs from the bulk of the first material layer 304 (e.g., nickel) to the surface of the first material layer 304. In the third stage, carbon precipitation occurs as a result of a decrease of the chamber temperature. In the fourth stage, the grain boundaries of the first material layer 304 serve as active sites for the growth of the graphene layer 306 while the chamber is being cooled down. For example, the reaction chamber may be cooled down at a rate of 500 degrees Celsius per minute to 5 degrees Celsius per minute. The graphene layer 306 may also be deposited using other methods known in the art. In the present embodiment, the graphene layer 306 has a thickness in a range from 5 to 50 nm such as from 5 to 10 nm. For example, the graphene layer 306 may be deposited to about 5 nm thick. For another example, the graphene layer 306 may be deposited to about 20 nm thick. The thickness of the graphene layer 306 can be designed according to the wavelength of the EUV radiation to be used. On the one hand, a thicker graphene layer absorbs more EUV radiation than a thinner graphene layer does for the same EUV wavelength. Therefore, it is desirable to have a graphene layer that is sufficiently thin for maximizing EUV pass-through efficiency. On the other hand, graphene is relatively brittle, having a relatively low fracture toughness compared to many metallic materials. Therefore, it is desirable to have a graphene layer that is thick enough to avoid breakages during the pellicle's manufacturing, assembling, and handling processes. After the graphene layer 306 is deposited, an assembly 308 is formed, having the substrate 302, the first material layer 304 over the substrate 302, and the graphene layer 306 over the first material layer 304 (FIG. 3C). A surface 306a of the graphene layer 306 is exposed, which is opposite to another surface 306b of the graphene layer 306.

At operation 208, the method 200 (FIG. 2) attaches the assembly 308 to a carrier 314 (FIG. 3D). In an embodiment, the graphene layer 306, more particularly the surface 306a, is in direct contact with the carrier 314. In an embodiment, the carrier 314 is an adhesive-less carrier and uses electrostatic charges as the mechanism for the attachment. For example, the carrier 314 may be made of ceramic and powered by one or more batteries which are used for generating the electrostatic charges. In addition, the carrier 314 may attach to the graphene layer 306 only along a perimeter of the carrier 314 (e.g., a brim of the carrier 314). For example, the carrier 314 may be in a shape of a cup (e.g., a suction cup), and only the brim of the cup is in direct contact with the graphene layer 306 when the assembly 308 is attached to the carrier 314. In an embodiment, the brim of the carrier 314 conforms to the shape of the pellicle such that the graphene layer 306 is stretched flat in the subsequent manufacturing processes. One benefit of using the carrier 314 is that it can be attached to and detached from the graphene layer 306 at ease without damaging the graphene layer 306.

At operation 210, the method 200 (FIG. 2) removes the substrate 302 from the assembly 308. In an embodiment, operation 210 includes a grinding process or a chemical mechanical polishing (CMP) process followed by one or more etching processes. To further this embodiment, the grinding process or the CMP process partially removes the substrate 302 until only a thin layer of the substrate 302 remains over the first material layer 304. For example, the remaining layer of the substrate 302 may be of 30 to 50 angstroms (Å) thick. This prevents the grinding process or the CMP process from inadvertently removing the first material layer 304 and damaging the graphene layer 306. In an embodiment, operation 210 uses a timer to determine when to stop the above grinding process or CMP process. Subsequent to the grinding process or the CMP process, operation 210 removes the remaining layer of the substrate 302 using an etching process, which may be a wet etching or a dry etching. The etching process is selective to the substrate 302 and stops at the first material layer 304. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In an embodiment, the substrate 302 comprises silicon (therefore a silicon substrate 302) and the first material layer 304 comprises nickel (therefore a nickel layer 304), the etching process may use potassium hydroxide (KOH) solution as the wet etchant, which selectively etches the silicon substrate 302 but not the nickel layer 304. Alternatively, the etching process may use a fluorine-containing gas (e.g., $CF_4$, $SF_6$, $CH_2F_2$, $CHF_3$, and/or $C_2F_6$) in a dry etching process. The fluorine-containing gas selectively etches the silicon substrate 302 but not the nickel layer 304.

Figures 3E, 3F:
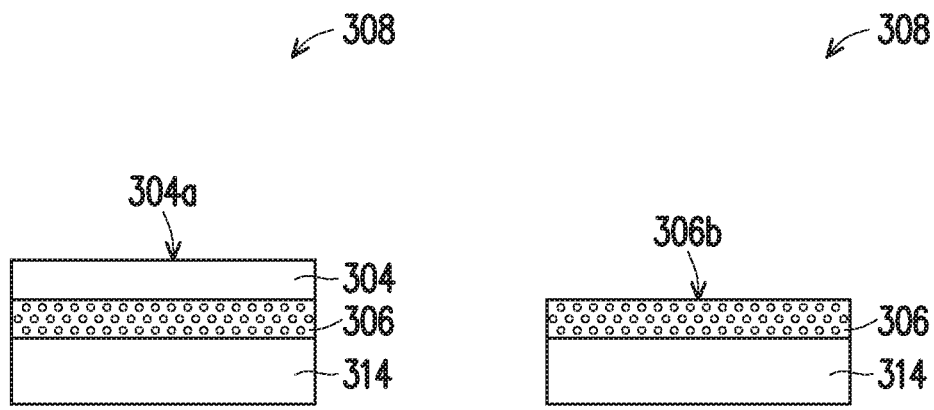

In another embodiment, operation 210 removes the entire substrate 302 using a dry etching process (i.e., without using a grinding process, a CMP process, or a wet etching process). The dry etching process is selective to the material(s) of the substrate 302 and stops at the first material layer 304. The etching gas may be one or more of the gases discussed above. In an embodiment, the substrate 302 comprises silicon and the first material layer 304 comprises nickel, the dry etching process may use a fluorine-containing gas (e.g., $CF_4$, $SF_6$, $CH_2F_2$, $CHF_3$, and/or $C_2F_6$) to selectively remove the silicon substrate 302 and stops at the nickel layer 304. In yet another embodiment, operation 210 may use a wet etching process to remove the entire substrate 302, using one or more of the wet etchant discussed above. After the substrate 302 is removed from the assembly 308 using, for example, one of the above embodiments, a surface 304a of the first material layer 304 is exposed, as shown in FIG. 3E.

At operation 212, the method 200 (FIG. 2) removes the first material layer 304 from the assembly 308. In an embodiment, prior to removing the first material layer 304, operation 212 cleans the exposed surface 304a of the first material layer 304. This removes any residues from the prior processes, such as the grinding, polishing, and/or etching of the substrate 302. Subsequently, operation 212 removes the first material layer 304 using one or more etching processes. In an embodiment, the first material layer 304 comprises nickel (therefore it is a nickel layer 304) and operation 212 removes the nickel layer 304 by dipping the assembly 308 and the carrier 314 in a wet etchant containing ferric chloride ($FeCl_3$) or by spraying the wet etchant containing ferric chloride ($FeCl_3$) onto the first material layer 304. In another embodiment, operation 212 removes the nickel layer 304 using a dry etching process with a chlorine-containing gas as the etching gas. For example, operation 212 may place the assembly 308 and the carrier 314 in a dry etching chamber, supply chlorine gas and oxygen gas into the dry etching chamber, and produce inductively coupled plasma that etches away the nickel layer 304. Alternatively, operation 212 may supply boron trichloride ($BCl_3$) gas and argon gas into the dry etching chamber and produce inductively coupled plasma that etches away the nickel layer 304. After the first material layer 304 is removed from the assembly 300, the surface 306b of the graphene layer 306 is exposed, as shown in FIG. 3F. In the present embodiment, throughout the operation 212, the carrier 314 is attached to the graphene layer 306 to keep it stretched flat.

Figure 3G:
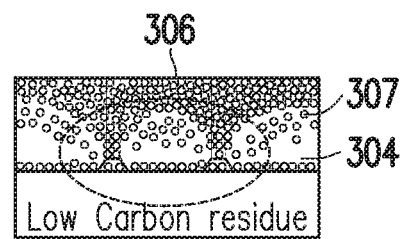

At operation 214, the method 200 (FIG. 2) cleans or treats the exposed surface 306b to improve the quality of the graphene layer 306. When the graphene layer 306 is deposited over the first material layer 304 (FIG. 3C), some carbon atoms 307 may diffuse into the grain boundaries of the first material layer 304, as shown in FIG. 3G. As a result, the surface 306b may comprise carbon residues after the first material layer 304 is removed. Operation 214 applies oxygen plasma to the graphene layer 306, particularly to the surface 306b. The oxygen plasma removes the carbon residues, if any, and smooth out the surface 306b, improving the purity and flatness of the graphene layer 306.

Figure 3H:
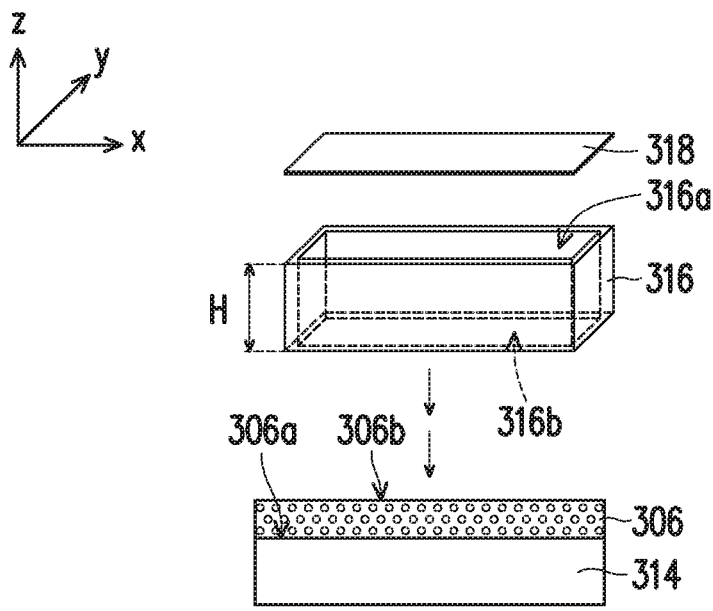
FIG. 3H illustrates a partial cross-sectional view and a partial perspective view of the apparatus of FIGS. 3I and 3J, according to some embodiments of the present disclosure.
Figures 3I, 3J:
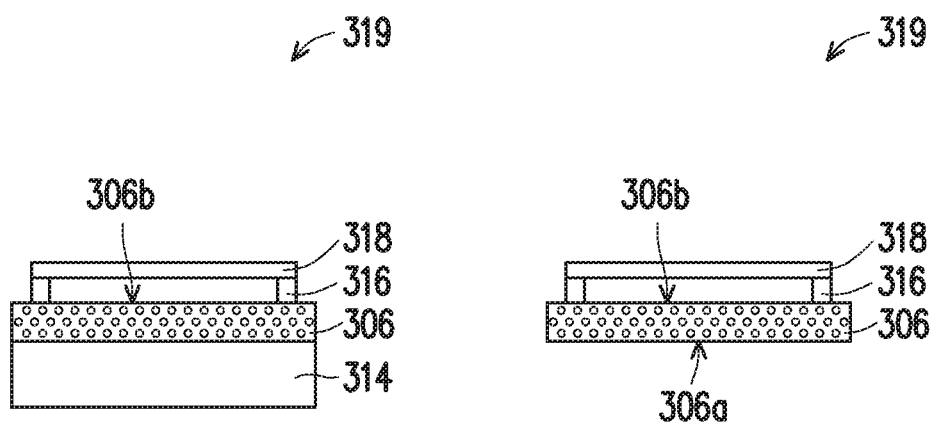

At operation 216, the method 200 (FIG. 2) attaches or mounts a pellicle frame 316 to the graphene layer 306 while it is still attached to the carrier 314. FIG. 3H illustrates a perspective view of the pellicle frame 316 and a protective cover 318 in accordance to an embodiment. FIG. 3H also illustrates a cross-sectional view of the graphene layer 306 and the carrier 314. The pellicle frame 316 is a rigid structure in the present embodiment. For example, it may be made of anodized aluminum alloy or another rigid material suitable for use in EUV lithography processes. The shape of the pellicle frame 316 conforms to the shape of the target EUV mask such as the mask 108 of FIG. 1. For example, if the target EUV mask is a rectangular plate, then the pellicle frame 316 is made into a rectangular enclosure with four solid sides and two open sides 316a and 316b that are opposite to each other. The height H of the pellicle frame 316 (a distance between the open sides 316a and 316b along the "z" axis) is designed such that any contaminants on the surface 306a of the graphene layer 306 are out of focus during the EUV lithography processes. In an embodiment, the height H ranges from 3.5 to 5 millimeters (mm). The pellicle frame 316 is adhesively attached (for example, using silicone resin as the adhesive) to the graphene layer 306, particularly to the surface 306b of the graphene layer 306, thereby forming a pellicle assembly 319 (FIG. 3I). For example, the pellicle frame 316 may be pressed onto the surface 306b with a suitable pressure-sensitive adhesive between them. In the embodiment shown in FIG. 3H, operation 216 further attaches the protective cover 318 to the pellicle frame 316 to cover the open side 316a. The protective cover 318 is removable and may comprise plastic in an embodiment. Once attached to the pellicle frame 316, the protective cover 318 protects the surface 306b of the graphene layer 306 from outside contaminants. This is particularly useful during transportation and handling of the pellicle assembly 319. The protective cover 318 can be attached before or after the pellicle frame 316 is attached to the graphene layer 306. FIG. 3I shows that the protective cover 318 is attached to the pellicle frame 316 which is attached to the graphene layer 306.

At operation 218, the method 200 (FIG. 2) detaches the carrier 314 from the graphene layer 306, thereby providing the pellicle assembly 319 standalone (FIG. 3J). Referring to FIG. 3J, the pellicle assembly 319 includes the pellicle frame 316, the graphene layer 306, and the protective cover 318. The graphene layer 306 is adhesively attached to the pellicle frame 316, while the protective cover 318 is removably attached to the pellicle frame 316. In the present embodiment, the graphene layer 306 has a larger surface area than the open side 316b of the pellicle frame 316 (see FIG. 3H). For example, the graphene layer 306 may have the same shape and size as the substrate 302 which may be an eight inch wafer or a twelve inch wafer, while the open side 316b is a rectangle of about 150 mm by 118 mm. Therefore, the graphene layer 306 fully covers the open side 316b. The portions of the graphene layer 306 that extend beyond the pellicle frame 316 may be trimmed. In an embodiment, the method 200 further includes removing the protective cover 318 and mounting the pellicle assembly 319 to a mask opposite the graphene layer 306. This forms a pellicle/mask assembly, such as the pellicle 107 and the mask 108 in FIG. 1. In an embodiment, the pellicle frame 316 may include holes on its solid sides for maintaining proper air pressure inside the pellicle assembly 319 during EUV exposure processes.

In the above process, the graphene layer 306 is always supported by at least one film or apparatus, such as the first material layer 304 and the carrier 314. Therefore, the graphene layer 306 is always stretched flat and its shape remains substantially the same throughout the process. As a result, the graphene layer 306 is substantially free of wrinkles and breakages. Furthermore, embodiments of the present disclosure employ various dry etching processes when removing the substrate 302 and the first material layer 304, which advantageously maintains the graphene layer 306 free of wrinkles and breakages. Still further, embodiments of the present disclosure can be implemented for large-volume production of pellicles or pellicle membranes using graphene. These are non-limiting benefits provided by the embodiments of the present disclosure.

In one exemplary aspect, the present disclosure is directed to a method. The method includes depositing a first material layer over a substrate; and depositing a graphene layer over the first material layer, thereby forming a first assembly. The method further includes attaching a carrier to the graphene layer; removing the substrate from the first assembly; and removing the first material layer from the first assembly.

In another exemplary aspect, the present disclosure is directed to a method. The method includes depositing a nickel layer over a substrate; and depositing a graphene layer over the nickel layer, thereby forming a first assembly having the substrate, the nickel layer, and the graphene layer. The method further includes attaching a carrier to the first assembly and over the graphene layer; removing the substrate from the first assembly; and removing the nickel layer from the first assembly, thereby exposing the graphene layer.

In yet another exemplary aspect, the present disclosure is directed to a method. The method includes depositing a nickel layer over a silicon substrate; and depositing a graphene layer over the nickel layer, thereby forming a first assembly having the silicon substrate, the nickel layer, and the graphene layer. The method further includes attaching a carrier to the first assembly and over the graphene layer;

removing the silicon substrate from the first assembly; removing the nickel layer from the first assembly, thereby exposing the graphene layer; and mounting a pellicle frame to the graphene layer and opposite the carrier.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing a first material layer over a substrate;
depositing a graphene layer over the first material layer, thereby forming a first assembly having the substrate, the first material layer, and the graphene layer;
attaching a carrier to the graphene layer;
removing the substrate from the first assembly; and
removing the first material layer from the first assembly.

2. The method of claim 1, after the removing of the first material layer, further comprising:
mounting a pellicle frame to the first assembly and opposite the carrier; and
detaching the carrier from the first assembly, resulting in a second assembly having the graphene layer and the pellicle frame.

3. The method of claim 2, further comprising:
attaching a protective cover to the pellicle frame.

4. The method of claim 2, wherein the pellicle frame comprises aluminum alloy.

5. The method of claim 2, further comprising:
trimming a portion of the graphene layer that extends beyond the pellicle frame.

6. The method of claim 2, where the pellicle frame is mounted to the first assembly with a pressure-sensitive adhesive.

7. The method of claim 1, wherein the substrate comprises silicon and the first material layer comprises nickel.

8. The method of claim 1, wherein the depositing of the first material layer includes sputtering deposition of a layer of nickel to a thickness ranging from 50 to 500 nanometers (nm).

9. The method of claim 1, wherein the depositing of the graphene layer includes chemical vapor deposition and the graphene layer is deposited to a thickness ranging from 5 to 50 nm.

10. The method of claim 1, wherein the carrier is attached to the graphene layer by electrostatic charges.

11. The method of claim 1, wherein the removing of the substrate and the first material layer include a dry etching process.

12. A method, comprising:
depositing a nickel layer over a substrate;
depositing a graphene layer over the nickel layer, thereby forming a first assembly having the substrate, the nickel layer, and the graphene layer;
attaching a carrier to the first assembly and over the graphene layer;
removing the substrate from the first assembly; and
removing the nickel layer from the first assembly, thereby exposing the graphene layer.

13. The method of claim 12, further comprising:
mounting a pellicle frame to the graphene layer and opposite the carrier.

14. The method of claim 13, wherein the pellicle frame comprises aluminum alloy.

15. The method of claim 13, wherein the pellicle frame is a rectangular enclosure with four solid sides and two open sides opposite to each other, wherein one of the two open sides is mounted to the graphene layer.

16. The method of claim 13, wherein the mounting of the pellicle frame to the graphene layer includes applying a pressure-sensitive adhesive between the pellicle frame and the graphene layer.

17. The method of claim 12, wherein the carrier is attached to the first assembly by electrostatic charges.

18. A method, comprising:
depositing a nickel layer over a silicon substrate;
depositing a graphene layer over the nickel layer, thereby forming a first assembly having the silicon substrate, the nickel layer, and the graphene layer;
attaching a carrier to the first assembly and over the graphene layer;
removing the silicon substrate from the first assembly;
removing the nickel layer from the first assembly, thereby exposing the graphene layer; and
mounting a pellicle frame to the graphene layer and opposite the carrier.

19. The method of claim 18, wherein the pellicle frame forms a rectangular enclosure with four solid sides and two opposite open sides, wherein one of the two opposite open sides is mounted to the graphene layer with a pressure-sensitive adhesive.

20. The method of claim 18, further comprising:
trimming a portion of the graphene layer that extends beyond the pellicle frame.

* * * * *